(12) United States Patent
Znamenskiy

(10) Patent No.: US 9,606,450 B2
(45) Date of Patent: Mar. 28, 2017

(54) IMAGE PROJECTION APPARATUS AND METHOD

(75) Inventor: Dmitry Nikolaevich Znamenskiy, Eindhoven (NL)

(73) Assignee: KONINKLIJKE PHILIPS N.V., Eindhoven (NL)

(*) Notice: Subject to any disclaimer, the term of this patent is extended or adjusted under 35 U.S.C. 154(b) by 675 days.

(21) Appl. No.: 13/513,863

(22) PCT Filed: Jan. 3, 2011

(86) PCT No.: PCT/IB2011/050005
§ 371 (c)(1),
(2), (4) Date: Jun. 5, 2012

(87) PCT Pub. No.: WO2011/083411
PCT Pub. Date: Jul. 14, 2011

(65) Prior Publication Data
US 2012/0242911 A1    Sep. 27, 2012

(30) Foreign Application Priority Data
Jan. 5, 2010  (EP) .................. 10150078

(51) Int. Cl.
*G03B 27/32* (2006.01)
*G03F 7/20* (2006.01)
*H04N 9/31* (2006.01)

(52) U.S. Cl.
CPC ...... *G03F 7/70358* (2013.01); *G03F 7/70308* (2013.01); *H04N 9/317* (2013.01); *H04N 9/3185* (2013.01)

(58) Field of Classification Search
CPC ................. G03B 27/32; G03B 27/52
(Continued)

(56) References Cited

U.S. PATENT DOCUMENTS 5,231,471 A * 7/1993 Torigoe .................... 356/401
5,402,184 A * 3/1995 O'Grady et al. .......... 348/764
(Continued)

FOREIGN PATENT DOCUMENTS

EP    0715213 A1    5/1996
JP    H08153661 A   6/1996
(Continued)

OTHER PUBLICATIONS

Lee et al: "Automatic Projector Calibration With Embedded Light Sensors"; UIST '04, Oct. 2004, ACM, pp. 1-4.
(Continued)

*Primary Examiner* — Steven H Whitesell Gordon
*Assistant Examiner* — Jerry Brooks

(57) ABSTRACT

An image projection apparatus comprises a light projector (605) which projects an image onto a surface (603) of an object. A focussing processor (609) is arranged to focus the image on an image plane (607) and a controller (611) dynamically varies the position of the image plane (607) relative to the surface (603). The movement may be a predetermined periodic movement and the surface may specifically be a non-planar surface. The movement may result in a blurring effect independent of distance, and may specifically provide a blurring effect that can be pre-compensated by pre-filtering of the image to be projected. The invention may allow improved quality of a projected image, such as e.g. of an image projected on a non-planar or moving surface.

15 Claims, 16 Drawing Sheets

(58) Field of Classification Search
USPC .............................. 353/53, 85, 121; 382/254
See application file for complete search history.

(56) References Cited

U.S. PATENT DOCUMENTS

| | | | |
|---|---|---|---|
| 5,742,376 A * | 4/1998 | Makinouchi | 355/53 |
| 6,069,738 A | 5/2000 | Cathey, Jr. et al. | |
| 6,302,542 B1 * | 10/2001 | Tsao | 353/7 |
| 7,365,917 B2 | 4/2008 | Zalevsky | |
| 7,444,014 B2 | 10/2008 | Dresser et al. | |
| 2003/0084422 A1 * | 5/2003 | Chan | 716/21 |
| 2003/0210383 A1 * | 11/2003 | Bjorklund et al. | 355/53 |
| 2004/0257540 A1 | 12/2004 | Roy et al. | |
| 2005/0168493 A1 * | 8/2005 | Damera-Venkata | 345/690 |
| 2006/0114446 A1 * | 6/2006 | Gui | 355/77 |
| 2007/0040998 A1 * | 2/2007 | Yamazaki et al. | 353/99 |
| 2007/0286514 A1 * | 12/2007 | Brown et al. | 382/254 |
| 2008/0212039 A1 * | 9/2008 | Taylor | 353/79 |
| 2009/0153579 A1 * | 6/2009 | Ichikawa et al. | 345/589 |
| 2009/0213335 A1 * | 8/2009 | Kondo et al. | 353/30 |

FOREIGN PATENT DOCUMENTS

| | | | | |
|---|---|---|---|---|
| JP | 2005070687 A | 3/2005 | | |
| JP | 2005107150 A | 4/2005 | | |
| JP | 2007316461 A | 12/2007 | | |
| WO | WO2009/060399 | * | 5/2009 | .............. F21V 7/04 |
| WO | 2010131142 A1 | 11/2010 | | |

OTHER PUBLICATIONS

Yoshida et al: "Transparent Cockpit: Visual Assistance System for Vehicle Using Retro-Reflective Projection Technology"; IEEE Virtual Reality, 2008, pp. 185-188.

Nagahara et al: "Flexible Depth of Field Photography"; European Confernece on Computer Vision (ECCV), Oct. 2008, pp. 1-14.

Hausler: "A Method to Increase the Depth of Focus by Two Step Image Processing"; Optics Communications, vol. 6, No. 1, Sep. 1972, pp. 38-42.

Choi et al: "Real-Time Geometric Calibration of Everywhere Display"; Autumn Academic Presentation Paper of Korea Information Science Society, vol. 33, No. 2, 2006, pp. 116-120.

* cited by examiner

ID: us-9606450-b2-col1

IMAGE PROJECTION APPARATUS AND METHOD

FIELD OF THE INVENTION

The invention relates to a projection of an image on an object and in particular, but not exclusively, to projection of an image on a non-planar surface.

BACKGROUND OF THE INVENTION

Projection of images from an image projector typically uses a static setup wherein the image projector projects the image on a screen that is flat and arranged perpendicularly to the axis from the image projector to the center of the screen. The image projector comprises a focus lens such that the image is sharp and in focus at a given plane at a given distance from the image projector. The plane at which the projected image is in focus is known as the image plane. In a traditional system, the focus is set such that the image plane coincides with the plane of the screen. Such a focusing of the image is typically performed manually and results in a sharp image being presented.

However, whereas such a conventional system works well in many scenarios, it also has a number of disadvantages that make it less advantageous for some applications. For example, the approach requires a planar screen perpendicular to the axis between the image projector and the screen and is less suitable to a system wherein the image is projected on a non-planar surface.

For example, FIG. 1 illustrates an example wherein an image is projected by a projector 101 on a non-planar projection surface 103. As illustrated, the projector 101 may be adjusted such that the image plane 105 coincides with the projection surface 103 at some points but it is not possible for the image plane 105 to coincide with the surface 103 as such, i.e. at all points. Thus, the actual projection surface 103 will deviate from the image plane 105 and accordingly the projected image will not be in focus but will appear to not be sharp except for the specific areas where the surface 103 coincides with the image plane 105. Thus, the projected image(s) appear sharp only on the part of the surface 103 coinciding with the image plane 105. On other parts of the surface 103 (those deviating from the image plane 105), the image appears blurred due to de-focus. As a result, a substantial loss in perceived sharpness of the image may be perceived by a viewer.

In order to address such problems, one can measure the surface geometry and to design an appropriate lens that can compensate for the surface variations. However this approach is possible only with a small class of surface shapes, it is expensive and it limits the application of the projector to a specific installation/surface. In order to address the latter problem, one can use an adaptive optical system which automatically adjusts the lens system to the surface geometry. However, such adaptive optical systems are extremely expensive and are accordingly used in satellite applications but are not appropriate for e.g. consumer products.

As another example, traditional systems tend to have disadvantages when images are projected on a moving target, i.e. when the projection surface is moving. FIG. 2 illustrates an example wherein a projector 201 projects an image on a moving surface 203 which is moving along the image plane 203. However, although the surface 203 coincides with the image plane, the movement of the surface 203 results in a motion blur which may be clearly noticeable by a viewer.

If the motion of the projection surface 105 is fully known and limited to a simple translation along the image plane, the motion blur may be compensated by the projector tracking the moving surface. Furthermore, if the motion of the target is fully known, the motion blur may potentially be compensated by a pre-filtering of the image prior to projection. The pre-filter can be determined from the motion. However, in many scenarios the movement is not known or is too complex for practical tracking or compensation. Furthermore, pre-filtering tends to lead to image distortions since the motion blur tends to be characterized by zeroes in the frequency response which cannot be compensated for by a practically implementable filter.

As yet another example, chromatic, spherical or astigmatic aberrations may tend to result in reduced sharpness. For example, as illustrated in FIG. 3, chromatic aberrations can result in slightly different image planes for the different colours thereby resulting in a de-focus and thus a less sharp image for at least one of the colours. Similarly, as shown in FIG. 4, spherical aberrations may result in a smearing of the focal point along the optical axis of the lens thereby resulting in a de-focus. The astigmatic lens aberrations can give a slightly curved image plane, as illustrated in FIG. 5. If the image is projected on the flat surface this may result in a partial image de-focus.

Hence, an improved image projection approach would be advantageous and in particular an approach allowing increased flexibility, improved perceived image sharpness, reduced complexity, facilitated implementation and/or improved performance would be advantageous.

SUMMARY OF THE INVENTION

Accordingly, the Invention seeks to preferably mitigate, alleviate or eliminate one or more of the above mentioned disadvantages singly or in any combination.

According to an aspect of the invention there is provided an image projection apparatus comprising: a light projector for projecting an image onto a surface of an object; focussing means for focussing the image on an image plane; a controller for dynamically varying a position of the image plane relative to the surface; and a filter for pre-compensating the image prior to the projection by the light projector.

The invention may allow an improved image projection in many scenarios and embodiments. In particular, the invention may in many scenarios provide improved image quality while maintaining a low complexity.

For example, the invention may allow improved image projection on a surface with a varying distance to the image projection and specifically on a non-planar surface. The invention may e.g. allow improved image projection on moving surfaces or may e.g. reduce the image degradation due to chromatic, spherical or astigmatic aberrations.

The approach may specifically introduce a de-focus or blurring of projected image at any given point of the surface. However, this blurring may be estimated/predicted relatively accurately and may furthermore be relatively independent of the distance to the image projection. Thus, compensation of the blurring may be facilitated and in particular the same compensation may be applied independently of the distance thereby allowing the same compensation to be applied across the image. Accordingly, an overall improved image quality may be achieved.

In particular, the dynamic variation of the relative position of the image plane results in a blurring of the projected image which is relatively predictable and relatively independent of the distance between the surface and the light projector. Furthermore, the blurring effect has a relatively well behaved response which allows a suitable inverse filter to be practically implementable. Thus, the filter may approximate an inverse filter of the blurring effect caused by the variation of the relative position of the image plane thereby resulting in the projected image on the surface providing a sharper image. Furthermore, the sharpness improvement is relatively independent of the distance between the light projector and the surface thereby allowing an efficient compensation on all areas of the surface—even without knowledge of the geometry of the surface. Accordingly, a substantially improved image quality may be achieved.

The pre-compensation may specifically be a compensation for a blurring effect caused by the variation of the position of the image plane relative to the surface.

The control means may be arranged to dynamically vary the distance from the light projector (e.g. measured from the lens of the light projector) to the image plane. Thus, the controller may dynamically adjust a focusing characteristic of the light projector to dynamically move the image plane. The controller may in some embodiments dynamically vary the distance between the surface and the light projector, e.g. by moving the projector or the object, or both of them.

The controller may automatically vary the position of the image plane relative to the object. The controller may introduce a continuous variation of the position of the image plane relative to the surface. In particular, the image plane may be continuously moved relative to the surface. Thus, in some embodiments, the image plane may never be static relative to the surface. The variation may occur without any user input and indeed the variation may be independent of any user input. Thus, the variation is introduced even if no manual user input is received. The controller may introduce a jitter to the position of the image plane relative to the surface. The variation may occur even if no variations in the characteristics of the light projector or the surface occur. In particular, the variation may be independent of characteristics of the image projection apparatus and/or the surface/object.

The image plane is a virtual plane on which the projected image is in focus.

In accordance with an optional feature of the invention, the filter is arranged to pre-compensate for a nominal blurring effect independent of a distance between the image plane and the surface.

This may in many embodiments provide improved image quality while maintaining low complexity. In particular, the nominal blurring effect may approximate the blurring that occurs as a function of the variation. The nominal blurring effect may be an approximation of the blurring effect at different distances and may specifically correspond to e.g. a weighted average of the blurring effect at different distances. Thus, the compensation may be based on an assumption of a fixed (distance independent) nominal blurring effect. The filter may specifically be an approximation of the inverse filter of the nominal blurring effect.

In accordance with an optional feature of the invention, the controller is arranged to impart a predetermined variation to the position of the image plane relative to the object.

This may provide improved performance, and typically improved perceived image quality, and/or facilitated implementation and/or operation.

In accordance with an optional feature of the invention, the controller is arranged to impart a periodic variation to the position of the image plane relative to the surface.

This may provide improved performance, and typically improved perceived image quality, and/or facilitated implementation and/or operation.

In accordance with an optional feature of the invention, the periodic variation corresponds to a triangular variation in a distance between the image plane and a point on the surface.

This may provide improved performance, and typically improved perceived image quality, and/or facilitated implementation and/or operation. The feature may in particular allow a low complexity implementation which provides very good performance in most embodiments.

The triangular variation may be substantially symmetric (with equal rising and falling slopes) or may be asymmetric. In particular, the triangular variation may substantially be a saw tooth shape with one slope having a duration no more than 10% of the other slope.

In accordance with an optional feature of the invention, the image is a frame of a video signal and the periodic variation has a period of no more than two frame durations.

This may allow particularly advantageous performance and in particular may allow improved image quality for a video image sequence. The feature in particular allows the variation and thus compensation etc to be performed for each frame.

In some embodiments, the periodic variation has a period of no more than one frame duration. This may allow particularly advantageous performance and in particular image quality for frames with moving content.

In some embodiments the periodic variation has a period of no more than 500 msec, 100 msec or 50 msec.

In accordance with an optional feature of the invention, the controller is arranged to dynamically vary a focus of the light projector.

This may allow particularly advantageous operation, performance and/or implementation in many embodiments. In particular, it may allow a flexible image projection apparatus which is suitable for use with a large variety of projection surfaces including various (unknown) non-planar surfaces and/or surfaces having a(n unknown) movement component.

In accordance with an optional feature of the invention, the controller is arranged to dynamically vary a position of the surface.

This may allow particularly advantageous operation, performance and/or implementation in many embodiments. In particular, it may allow improved backwards compatibility with many light projectors that do not support dynamic automated focus variations.

In accordance with an optional feature of the invention, the controller is arranged to vary a distance from the image projection apparatus to a point on the surface by at least a minimum distance from the image projection apparatus to the point.

The invention may provide improved performance, and typically specifically improved perceived image quality, and/or facilitated implementation and/or operation. In particular, the approach may provide a perceived sharpness of images projected with a large variation in the distance to the surface.

In accordance with an optional feature of the invention, the controller is arranged to provide a substantially linear movement to the image plane relative to the surface for positions of the image plane between an image point of the surface closest to the projector and an image point of the surface furthest from the light projector.

This may provide improved performance in many scenarios. In particular, it may allow a homogenous movement and thus blurring effect for all image points thereby resulting in the same pre-compensation filter being appropriate for all image points. An image point is a point on the surface used to present the image. An image point may be any point within an image area of the surface where the image area is the area of the surface in which the image is projected. The movement of the image plane relative to the surface may be substantially linear throughout its movement except for intervals of direction reversal. However, in some embodiments, the movement may be substantially linear within the interval from the closets image point to the furthest image point but non-linear for at least some distances outside this interval.

In accordance with another aspect of the invention, there is provided an image projection system comprising an image projection apparatus as described and including the object.

The invention may provide an image projection system with improved performance, and typically improved perceived image quality, and/or facilitated implementation and/or operation.

In accordance with an optional feature of the invention, the surface is a non-planar surface.

The invention may provide an image projection system for projection on non-planar surfaces.

In accordance with an optional feature of the invention, image projection system further comprises means for moving the surface, the movement having a movement component in a movement plane perpendicular to the image plane.

The invention may provide an image projection system for projection on moving surfaces.

In accordance with an optional feature of the invention, the system is a photolithography system.

The invention may provide an improved photolithography system.

According to an aspect of the invention there is provided a method of image projection comprising: a light projector projecting an image onto a surface of an object; focussing the image on an image plane; dynamically varying a position of the image plane relative to the surface; and a filter pre-compensating the image prior to the projection by the light projector.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME EMBODIMENTS OF THE INVENTION

Figure 6:
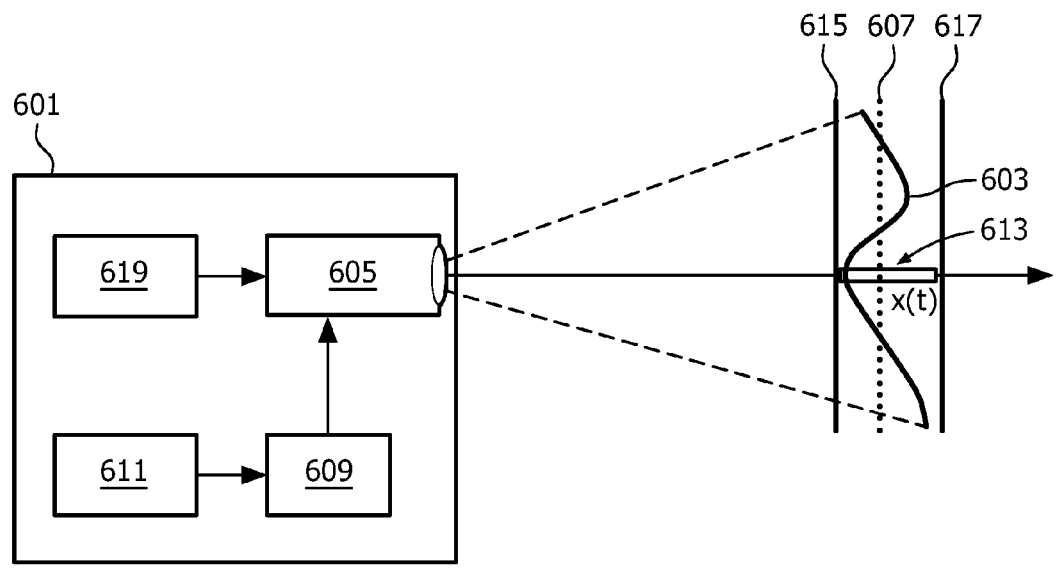
FIG. 6 is an illustration of an example of an image projection apparatus in accordance with some embodiments of the invention.

FIG. 6 illustrates an example of an image projection system in accordance with some embodiments of the invention.

The system comprises an image projection apparatus 601 which is arranged to project an image on a surface 603 of an object. In the specific example of FIG. 6, the surface 603 is a non-planar surface with a varying distance to the image projection apparatus 601 (along a direction perpendicular to the image plane) and in the specific example along an optical axis of the main lens of the image projection apparatus 601.

The image projection apparatus 601 comprises a light projector 605 which is arranged to project the image onto the surface of the object 603.

Figure 7:
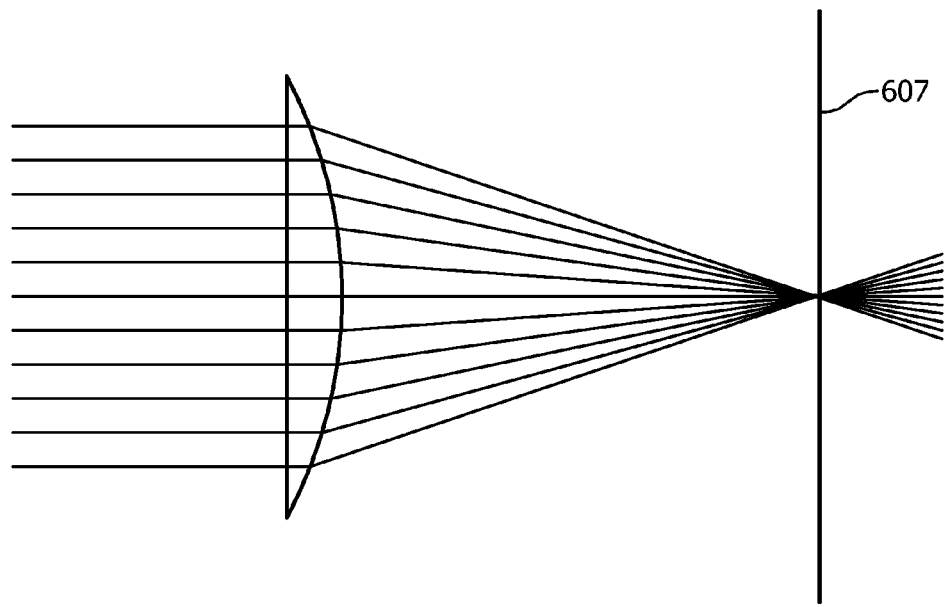
FIG. 7 is an illustration of an example of a lens focussing on an image plane.

The image projection apparatus 601 specifically comprises a focus adjuster 609 which can control the light projector 605 to focus the image on an image plane 607. Thus, the light projector 605 focuses the projected image on an image plane 607. In the specific example, the light projector 605 comprises a lens which focuses the projected image. As illustrated by FIG. 7, the image plane 607 is thus the plane at which all light for the same image point incident on the lens at different locations meets at the same point. The focus adjuster 609 may in the specific example control the distance between a light source of the light projector 605 and the lens such that the focus is sharp at a given distance, i.e. such that the image plane 607 is at a given distance. It will be appreciated that in other embodiments other means for focussing the projected image may be used, such as e.g. a controlled deformation of the lens or the relative adjustment of the position of a plurality of lenses.

The variation of the distance between the light projector 605 and the different points on the surface 603 may be fairly substantial. For example, the variation of the surface in the direction perpendicular to the image plane for the projected image may be at least 10% of the diagonal of the projected image area at a distance corresponding to the average distance from the image projector 605 to the surface 603.

The image projection apparatus 601 further comprises an image plane controller 611 which is coupled to the focus adjuster 609. The image plane controller 611 is arranged to control the position of the image plane 607 by controlling the focus adjustment performed by the focus adjuster 609. The image plane controller 611 is specifically arranged to dynamically vary a position of the image plane 607 relative to the surface 603. In the example of FIG. 6, the dynamic variation of the relative position of the image plane 607 and the surface 603 is achieved by varying the focus of the light projector 605 but it will be appreciated that in other embodiments, the focus may alternatively or additionally be achieved by moving the entire projector and/or the surface 607. For example, the image projection apparatus 601 may comprise a controller which generates a control signal for an external motor that moves the entire projector/surface 607 in a desired manner.

Figure 1:
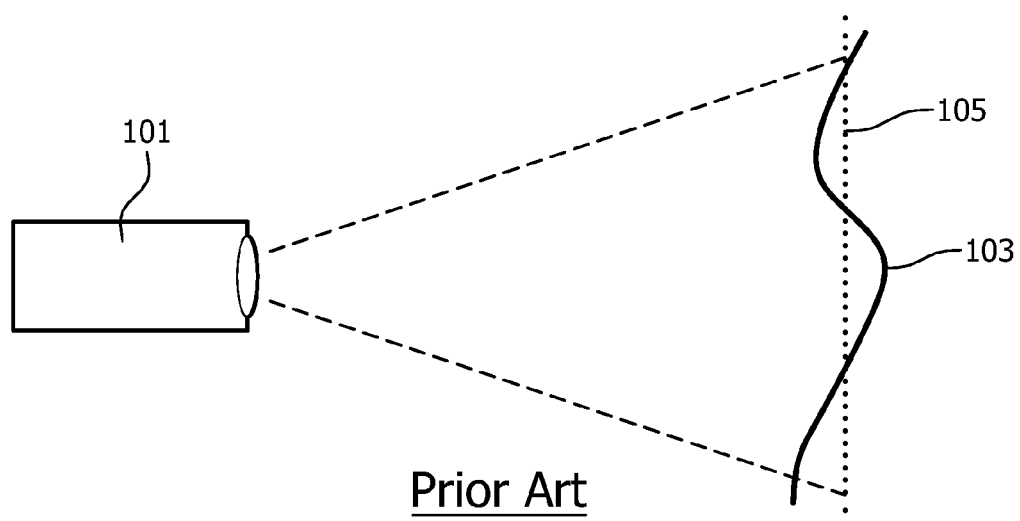
FIG. 1 is an illustration of an example of an image projection apparatus in accordance with prior art.
Figure 2:
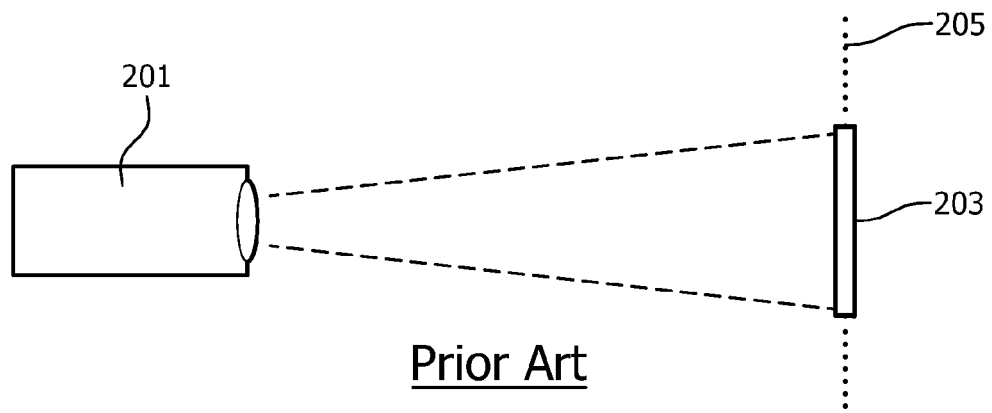
FIG. 2 is an illustration of an example of an image projection apparatus in accordance with prior art.
Figure 3:
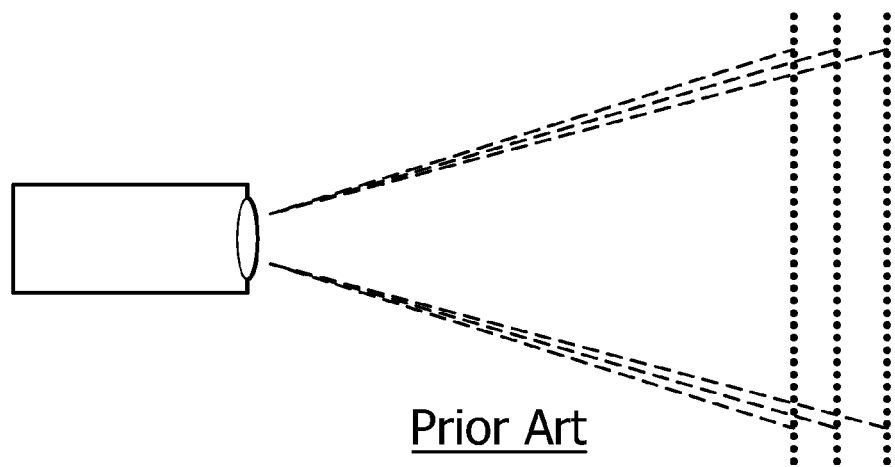
FIG. 3 is an illustration of an of chromatic aberration.
Figure 4:
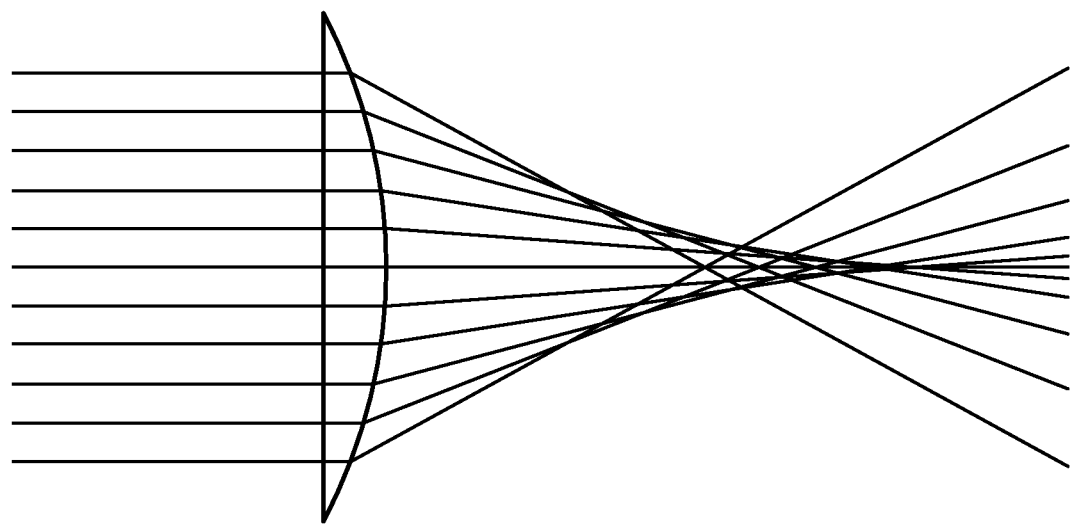
FIG. 4 is an illustration of an example of spherical aberration.
Figure 5:
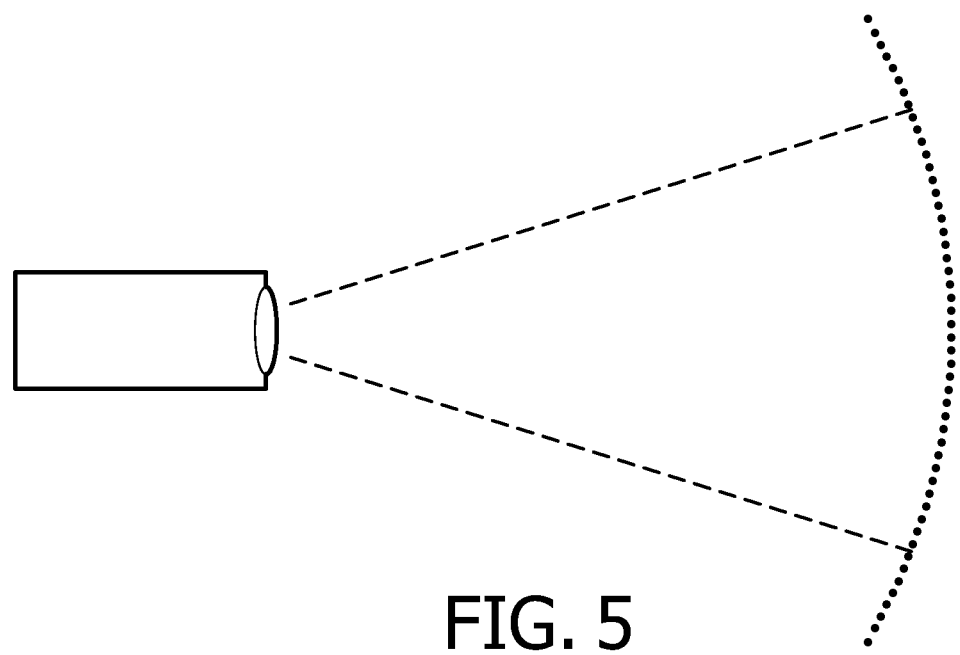
FIG. 5 is an illustration of an example of astigmatic aberration.

The image plane controller 611 is arranged to introduce a dynamic and automated movement of the image plane 607 relative to the surface 603, and in the example of FIG. 6 relative to the light projector 605 (the distance from the light projector 605 to the surface 603 is constant in the example of FIG. 1). The movement may specifically be a relative movement that is independent of any characteristics of the image and/or of any characteristics of the surface 603. In particular, the relative movement may be introduced on top of a nominal focus. For example, a user may manually adjust the focus to result in an image plane 607 at a given distance. On top of this nominal distance, the image plane controller 611 additionally introduces a dynamic movement which may specifically result in an average displacement of zero from the nominal image plane distance.

In the example of FIG. 6, a nominal image plane may for example be selected by a manual user focus. The image plane controller 611 may then introduce a focus adjustment which causes the image plane 607 to continuously be moved within an interval 613 from a closest image plane position 615 to a furthest image plane position 617. Thus, the image plane 607 is continuously varied and in the specific example the variation interval 613 is controlled to be larger than the variation in the distance to the non-planar surface.

The image plane jittering/movement accordingly has the effect that a given point on the surface 607 which is at a given (fixed) distance to the light projector 605 will experience time instants wherein the image is perfectly focused but will also experience time instants wherein the image is out of focus. Furthermore, this effect will be experienced by all points on the surface regardless of the exact distance of the surface to the light projector 605. Thus, whereas in a traditional system, the non-planar surface will have images that are sharp at some points and out of focus at other points, the current approach will result in a focus averaged image wherein each point is perceived as a combination of sharp and out of focus images. Such an approach may in many scenarios and for many applications result in an improved quality perception of the image.

Furthermore, the inventor has realized that the approach may be particularly advantageous because the perceptibly most significant impact is provided by images that are sharp or are only a little out of focus. Thus, for a given point on the surface 603, the most significant contribution in the perceived image for that point is provided at the time when the image plane 607 coincides with that point. The impact of the images at times when the image plane 607 does not coincide with the surface point reduces for an increasing distance of the image plane 607. Thus, the system provides an automatic weighting of the times in which the image is in focus and thus may provide improved perceived focus for the projected image on a non-planar surface.

Indeed, the system may be seen to effectively provide a snapshot effect of the projected image where only image projections within a certain time interval around the in-focus time instant (when the image plane coincides with the point on the surface) is significant. For example, the variation of the non-planar surface may be 80 cm in the direction of the axis perpendicular to the image plane 607. The variation interval may be set to 1 meter thus exceeding the surface variation. It may e.g. be found in such an embodiment that only the projection when the image plane 607 is within a distance of, say, ±10 cm is visually significant, and that the impact of the projections with an image plane 607 that is further away can be ignored (e.g. because they are so blurred that they do not provide any significant image content). In this case, each point will represent an image content which corresponds to the combined weighted effect of the projections when the image plane 607 is in the interval of [−10 cm, 10 cm] of the in-focus image. This will be the case for all points on the surface 603 regardless of the specific distance of the point to the light projector 605.

The inventor has realized not only that this effect is present but also that it is highly significant and can be advantageously used to provide an improved image presentation. In particular, the inventor has realized that as a consequence of this effect, the measured and perceived effect of the blurring resulting from the moving image plane is relatively independent of the actual distance of the point on the surface to the light projector 605. In other words, all points on the surface experience substantially the same blurring and distortion of the image. The inventor has furthermore realized that since all points experience a very similar blurring effect, this can be compensated by applying the same pre-compensation. Thus, independently of the specific point, the same pre-compensation can be used to improve the image quality and compensate for the blurring effect. Furthermore, the inventor has realized that the blurring effect caused by a moving image plane tends to be numerically well behaved and to allow relatively accurate inverse filters with a substantially limited domain to be implemented which can compensate for the blurring effect provided by the movement of the image plane.

Thus, a highly advantageous effect of the described system is that it converts the surface/distance dependent blurring/out-of-focus effect from known systems into a blurring effect that can be assumed to be independent of the distance of the individual point and thus independent of the specific surface geometry. Thus, the blurring effect can be considered to be equivalent to a nominal blurring effect for each point on the surface regardless of the actual distance and the exact blurring effect. In other words, a nominal (fixed) blurring effect (i.e. independent of the specific point/distance) can be used as a sufficiently close approximation of the exact blurring effect for the specific point/distance.

Accordingly, the pre-compensation can be performed without requiring any specific or detailed knowledge of the specific surface on which the image is projected (e.g. by just ensuring that the movement interval is larger than the surface variation (by a suitable margin)). Thus, the approach can be used with a large variety of surfaces without requiring any knowledge, measurement or calibration for the surface. Hence, a substantially more flexible and practical image projection system can be achieved.

Thus, the image projection apparatus 601 comprises a pre-filter 619 which receives the image to be projected and performs a pre-filtering of the image prior to it being projected. The pre-filter 619 may be controlled by first determining a blur kernel (the nominal blurring effect) which reflects the effect of the blurring caused by the movement of the image plane. This blur kernel may specifically be characterized as a spatial filter response which corresponds to the effect of the moving image plane. As previously set out, this blurring kernel can be assumed to be independent of the actual distance and thus may be assumed to be the same for all points of the image. Accordingly, the pre-filter may be determined as an approximation of the inverse filter of the blurring kernel.

Specifically, the blurring kernel (the effect of the blurring caused by the movement of the image plane relative to the surface) may be determined by averaging/integrating the blurring kernels corresponding to the different relative positions of the image plane and a flat surface at a nominal distance.

Consider a simplified projection system consisting of a lens and an illuminated object plane. The geometrical parameters of the optical system are the lens aperture a, the focal length of the lens f and distance between the object plane and the lens x. The projector focuses the light from the object plane at the image plane at a distance y from the other side of the lens, where x, y and f are related via the lens formula $$\frac{1}{x} + \frac{1}{y} = \frac{1}{f}.$$

If the distance to the surface L differs from y then the object appears blurred. Under reasonable assumptions the blurred image can be modeled as a sharp image (acquired with L=y) convolved with a disc or a Gaussian kernel with radius (variance) $b_{img}$ proportional to the lens aperture multiplied with the distance |y−L| between the image plane and the surface and divided by the distances between the image plane and the lens, i.e.:

$$b_{obj} = b_{img}\frac{x}{y} = |y - L|\frac{ax}{y^2}.$$

Figure 8:
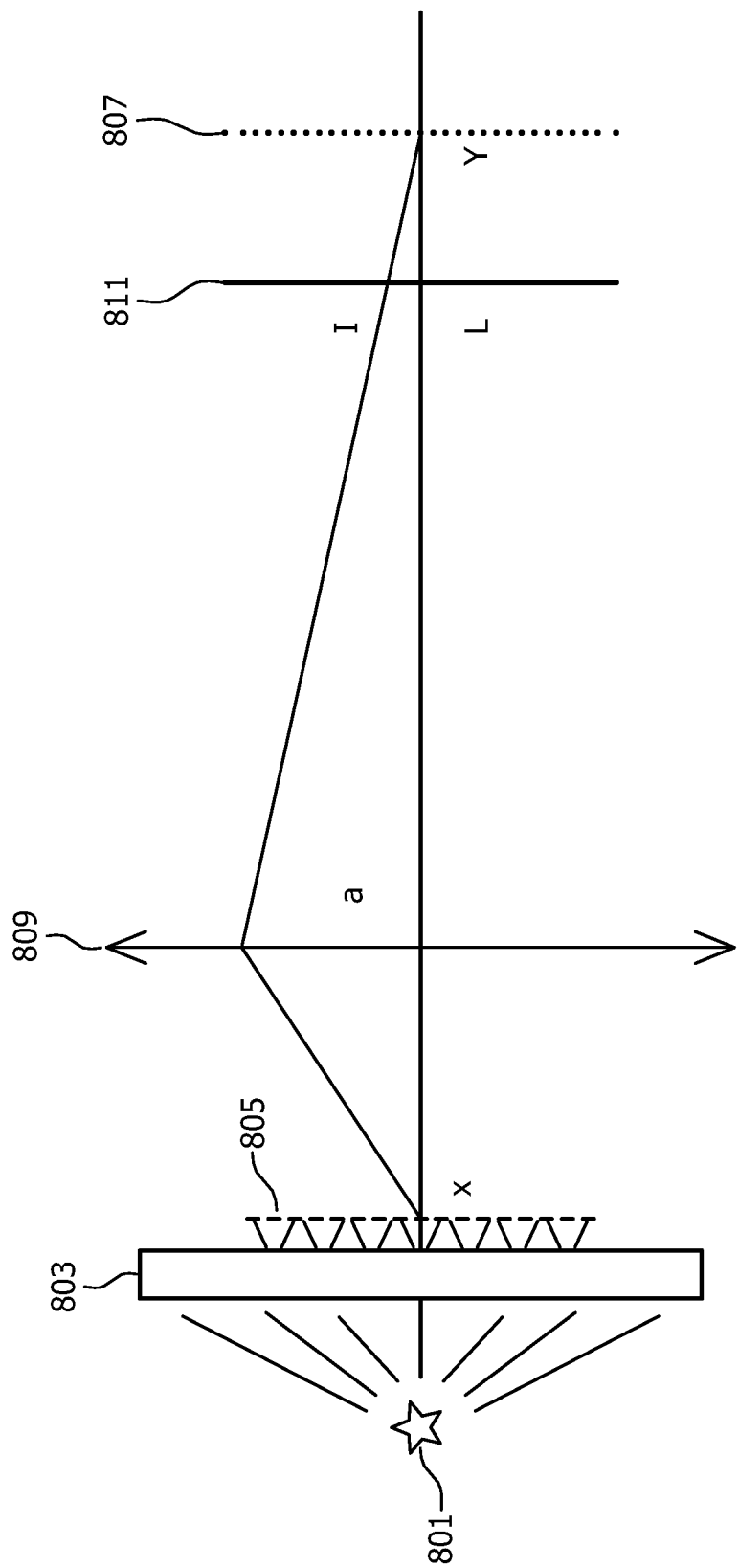
FIG. 8 is an illustration of an example of an optical system.

This is illustrated in FIG. 8 where a light source 801 illuminates a diffuser 803 which then illuminates the object plane 805. The light from the object plane 805 is focused on an image plane 807 by a lens 809. In the example, the image plane 807 does not coincide with the surface 811 of the plane on which the image is projected.

It should be noted that although the system with a moving image plane produces a blurring effect on the surface, the compensation for this effect should be applied on the other side of the lens, i.e. inside the projector, on the object plane. Thus, in order to quantize the blurring effect and define the proper compensation, an auxiliary notion of equivalent blurring on the object plane is introduced. The equivalent blurring is defined in such way that the same blurring effect can be achieved by a sharply focused projection of the pre-blurred image.

The blurring of the image on the surface with radius (variance) $b_{img}$ is then equivalent to a sharply focused projection of the object plane blurred with a kernel with the radius (variance) $b_{obj}$ where $b_{obj}$ and $b_{img}$ are related via the scaling ratio of the optical system, i.e.:

$$b_{img} = |y - L|\frac{a}{y}.$$

Figure 9:
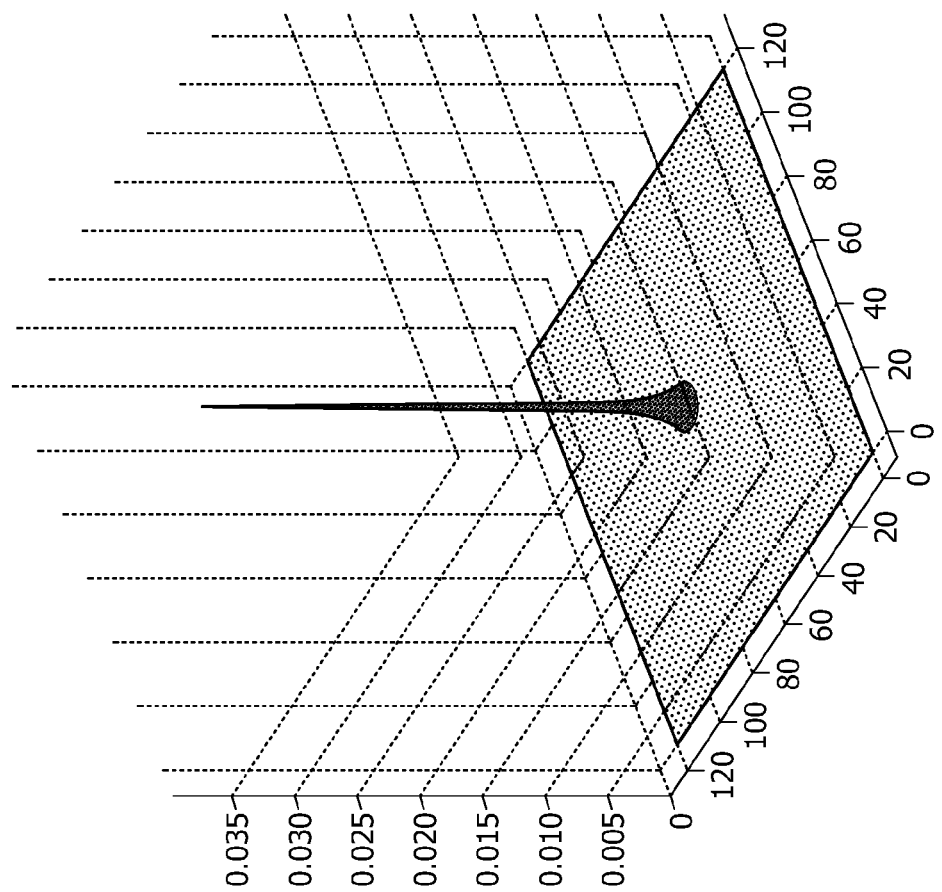
FIG. 9 is an illustration of an example of an equivalent blurring radius/variance as a function of time; and a resulting blur kernel.
Figure 9:
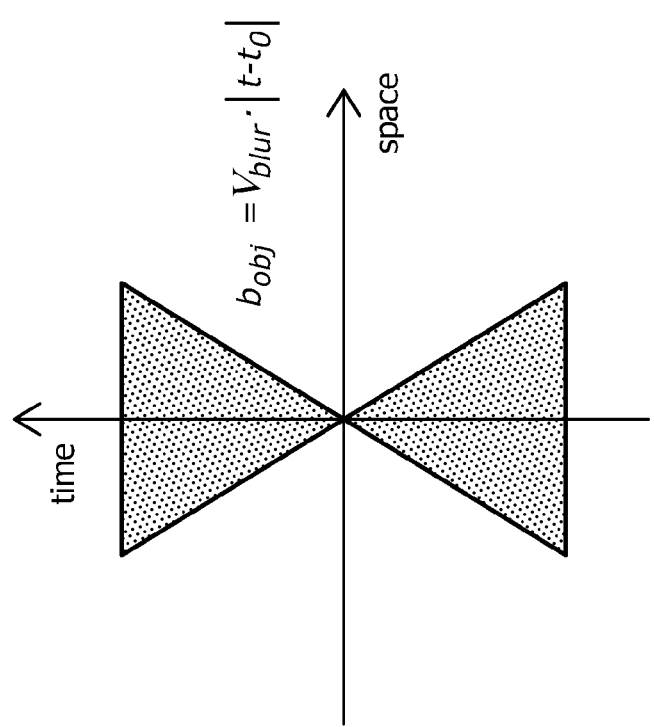

In the specific example the parameters of the optical system are controlled such that the movement of the image plane relative to the surface is close to linear and hence the equivalent blurring radius also changes in a linear way, i.e.

$$b_{obj} = b_{obj}(t) = V_{blur} \cdot |t - t_0|,$$

where $t_0$ is the moment of time the image plane coincides with the surface, as illustrated in FIG. 9. The required control of the optical system can be simplified to the control of a single parameter x, f or L. In an example implementation one can keep f and L unchanged while the object plane travels approximately linearly through $x_0$ at which the image plane coincides with the surface, i.e.

$$x = x(t) \approx x_O + V_x \cdot (t - t_0),$$

where $x_0$, L and f are related via the lens formula $$\frac{1}{x_0} + \frac{1}{L} = \frac{1}{f}.$$

In this case, the equivalent blurring radius can be found to change in an approximately linear way, i.e.

$$b_{obj}(t) = |y(t) - L|\frac{ax(t)}{y^2(t)} =$$

$$\frac{af^2V_x(L-f)|t-t_0| + (V_x(L-f))^2|t-t_0|(t-t_0)}{f^3 + f^2V_x(L-f)(t-t_0)} \approx \frac{aV_x(L-f)}{Lf}|t-t_0| =$$

$$V_{blur} \cdot |t - t_0|.$$

In another example implementation one can keep x and L unchanged while the focal length travels approximately linearly through $f_0$ at which the image plane coincides with the surface, i.e.

$$f = f(t) = f_O + V_f(t - t_0),$$

where x, L and $f_0$ are related via the lens formula $$\frac{1}{x} + \frac{1}{L} = \frac{1}{f_0}.$$

In this case, the equivalent blurring radius can be found to change in an approximately linear way, i.e.

$$b_{obj}(t) = |y(t) - L|\frac{ax}{y^2(t)} =$$

$$\frac{axV_x|t-t_0| + (x - f_0 - V_f(t-t_0))}{(x-f_0)(f_0 + V_f(t-t_0))^2} \approx \frac{aV_fx}{(f_0)^2}|t-t_0| = V_{blur} \cdot |t-t_0|.$$

In another example implementation, one can keep x and f unchanged while the distance between the lens and the surface changes approximately linearly through the image plane $y_0$ i.e.

$$L=L(t)=y_O+V_L \cdot (t-t_0),$$

where x, $y_0$ and f are related via the lens formula $$\frac{1}{x}+\frac{1}{y_0}=\frac{1}{f}.$$

In this case, the equivalent blurring radius can be found to change in an approximately linear way, i.e.

$$b_{obj}(t)=|y_0-L(t)|\frac{ax}{(y_0)^2}=\frac{axV_L}{(y_0)^2}|t-t_0|=V_{blur}\cdot|t-t_0|.$$

There are of course also other possible implementations where e.g. one can vary any combination of x f and L in order to make the image plane go through the surface in a close to linear way causing the close to linear change of the blurring radius, i.e.

$$b_{obj}=b_{obj}(t)=V_{blur}\cdot|t-t_0|, t\in[t_1,t_2],$$

Further we assume that the individual blurring kernels corresponding to the blurring radiuses/variances $b_{obj}(t)$ are known. If they are unknown one can approximate them by means of using disk kernels:

$$K_{individual}(x,y,b_{obj}(t))=\begin{cases}\frac{1}{\pi(b_{obj}(t))^2}, & \text{for } x^2+y^2\leq b_{obj}(t),\\ 0, & \text{for } x^2+y^2>b_{obj}(t,)\end{cases}$$

or approximate by means of the Gaussian kernels:

$$K_{individual}(x,y,b_{obj}(t))=\frac{1}{2\pi(b_{obj}(t))^2}\exp\left(\frac{-(x^2+y^2)}{2(b_{obj}(t))^2}\right)$$

Given the individual blurring kernels, the equivalent system blurring kernel can be approximated as an integral of individual blurring kernels with radius/variance $b_{obj}(t)$ over $t\in[t_1, t_2]$, i.e.

$$K_{system}(x,y)=\int_{t_2}^{t_Z}K_{individual}(x,y,b_{obj}(t))dt$$

Using the above formula one can compute a numerical approximation of the equivalent system blurring kernel. FIG. 9 contains an illustration of an example system blurring kernel.

Following the determination of the blurring kernel, the corresponding spatial pre-filter for compensation may then be computed by means of a numerical approximation to the inverse filter for the system kernel $K_{system}(x, y)$.

Figure 10:
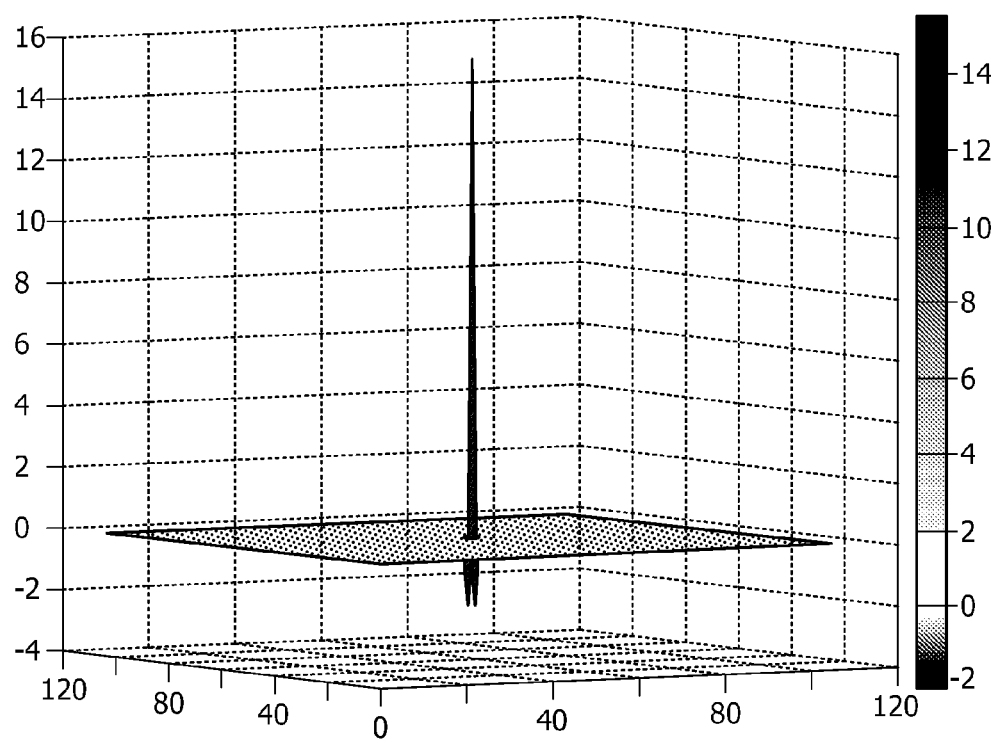
FIG. 10 is an illustration of an example of an inverse blurring kernel and its cross-section.
Figure 10:
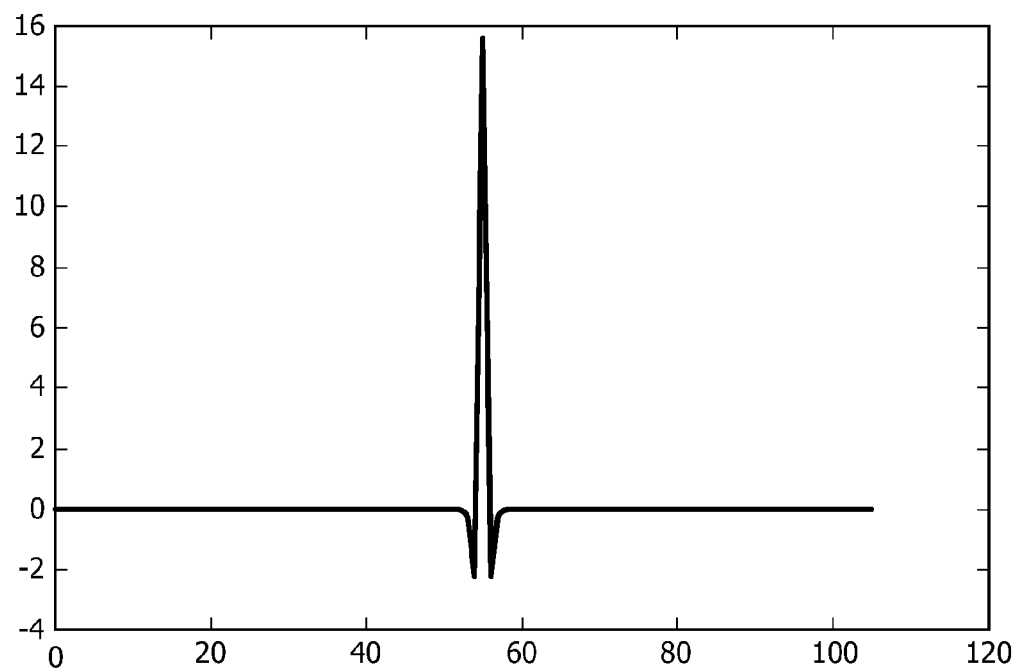

The inventor has also realized that while the system blurring kernel is an average of the individual blurring kernels, its frequency response is quite different. The individual blurring kernels are quite flat around zero and therefore they have well pronounced zeros in the frequency response. Thus the inversion of an individual kernel is an ill-defined problem. However, in contrast to the individual kernels, the system blurring kernel has very sharp peek at zero and therefore it results in a well-defined inverse with a compact support. FIG. 10 shows an example inverse kernel with a support practically limited to a few points around the zero. Thus a very practical and efficient pre-compensation can be achieved.

The described approach may thus provide a substantially improved projection of images on a non-planar surface. Indeed, the movement of the image plane relative to the surface provides a blurring effect which not only improves the projected image but which is also predictable and relatively constant for all distances (and accordingly points on the surface). Thus, the blurring effect caused by the moving image plane provides a predictable effect which can be homogenously compensated independently of distance thereby providing a sharper image for a large variety of distances to the individual points on the surface. Thus, independence of the specific characteristics of the surface, and specifically on the specific shape and geometry of the surface, is achieved.

Figure 11:
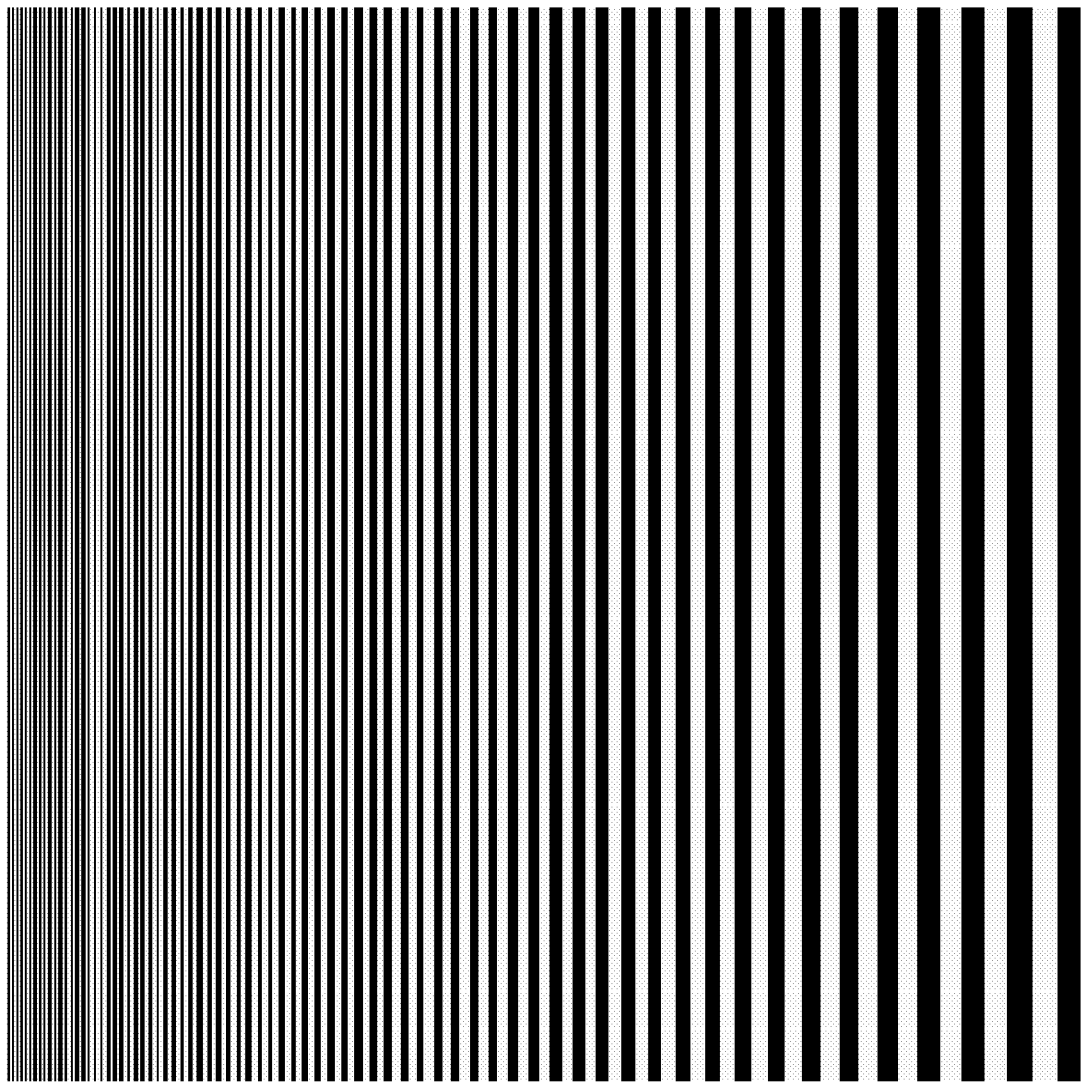
FIG. 11 is an illustration of a test pattern for an image projection system.
Figure 12:
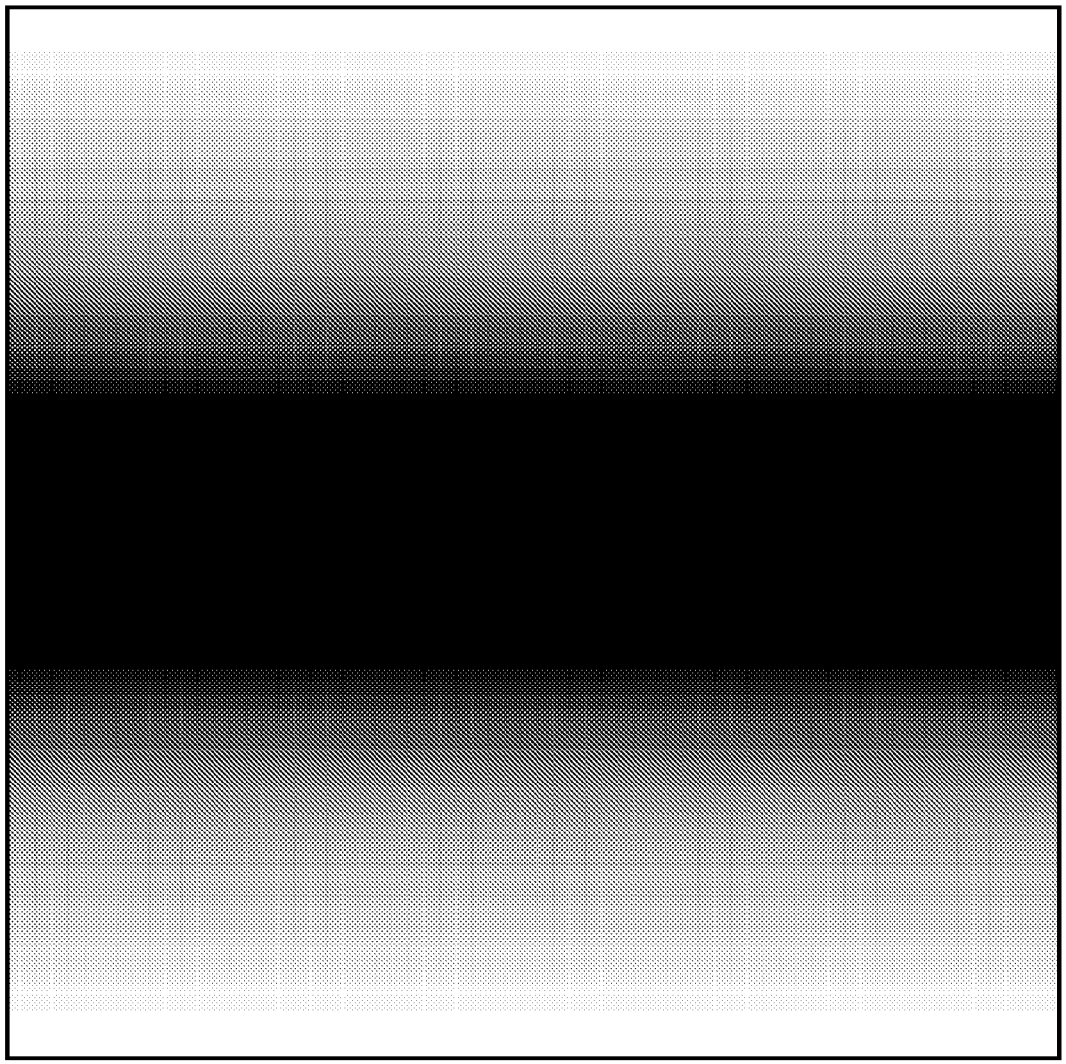
FIG. 12 is an illustration of an image focus pattern for a projection object of an image projection system.
Figure 13:
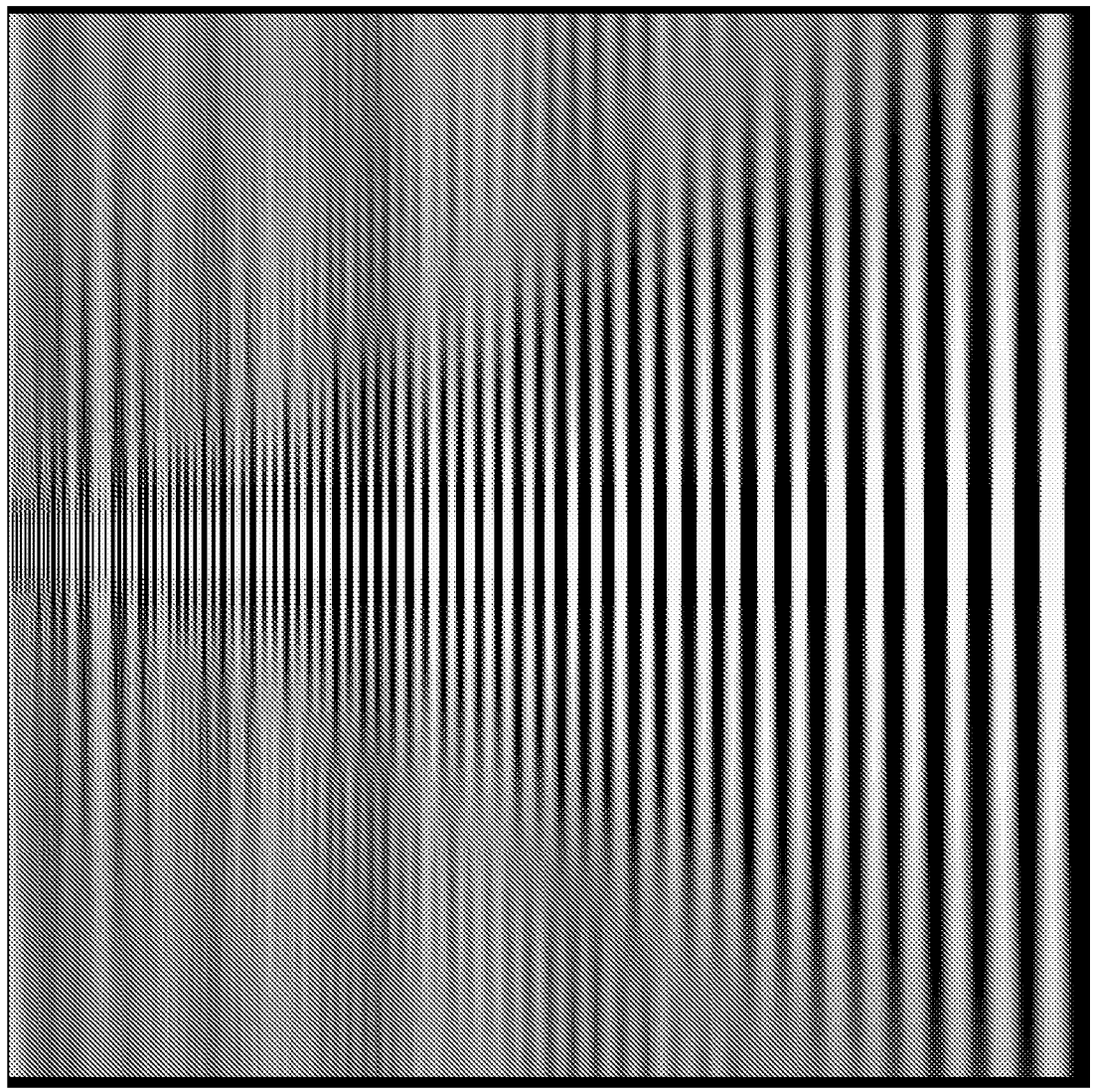
FIG. 13 is an illustration of a test image achieved for an image projection system in accordance with prior art.
Figure 14:
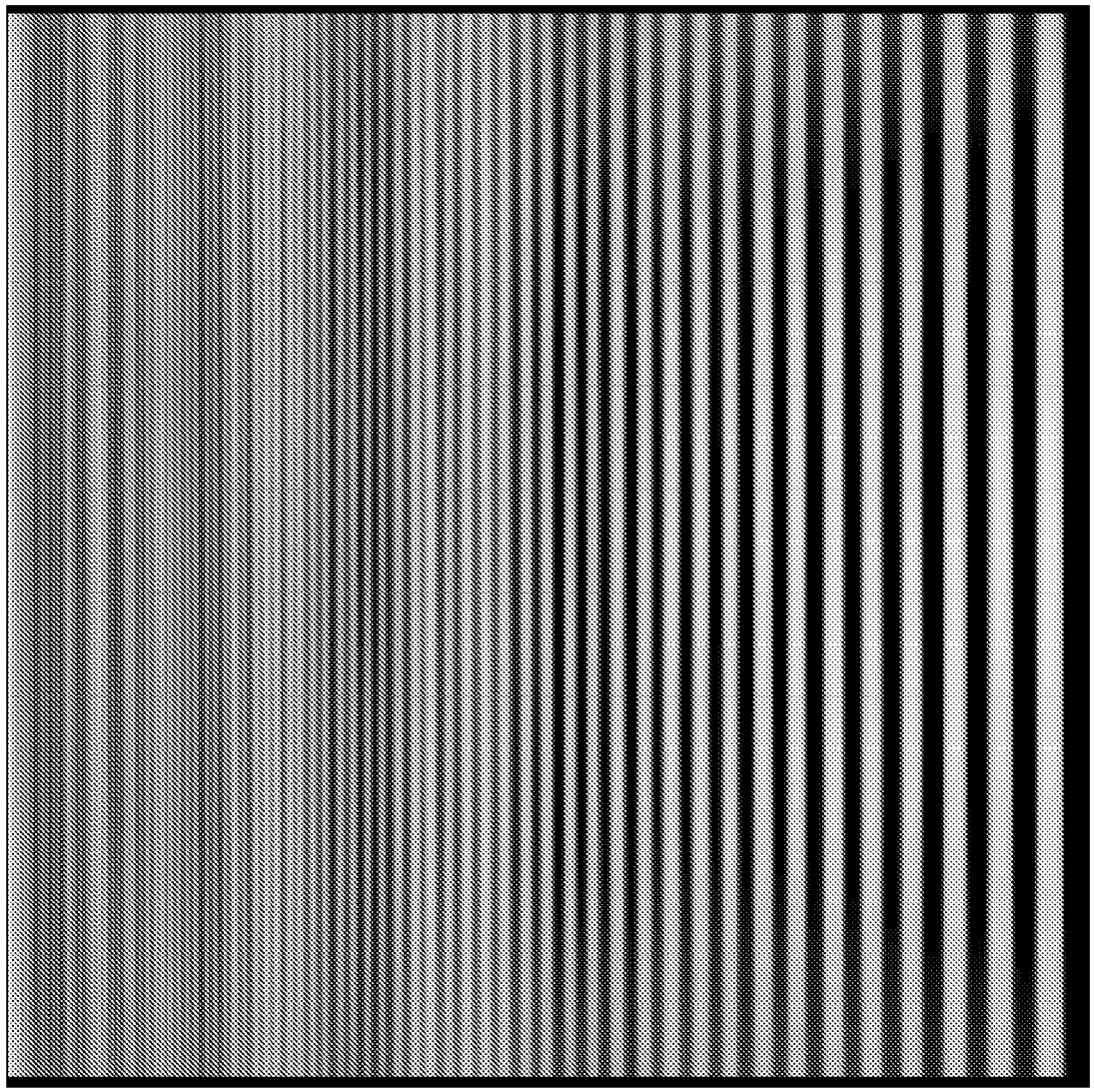
FIG. 14 is an illustration of a test image achieved for an image projection system in accordance with some embodiments of the invention.

For example, the test pattern of FIG. 11 may be projected on a specific non-planar surface having a shape as given by FIG. 12 wherein darker areas indicate decreasing distance between a fixed image plane and the point on the surface. FIG. 13 illustrates the resulting image using a conventional fixed image plane and FIG. 14 illustrates the result that can be obtained using a moving image plane together with a suitable pre-filter for compensation of the blurring effect. As illustrated, the approach using the moving image plane allows more accurate reproduction of high frequencies.

Figure 15:
FIG. 15 is an illustration of a test pattern for an image projection system.
Figure 16:
FIG. 16 is an illustration of a test image achieved for an image projection system in accordance with prior art.
Figure 17:
FIG. 17 is an illustration of a test image achieved for an image projection system in accordance with some embodiments of the invention.
Figure 18:
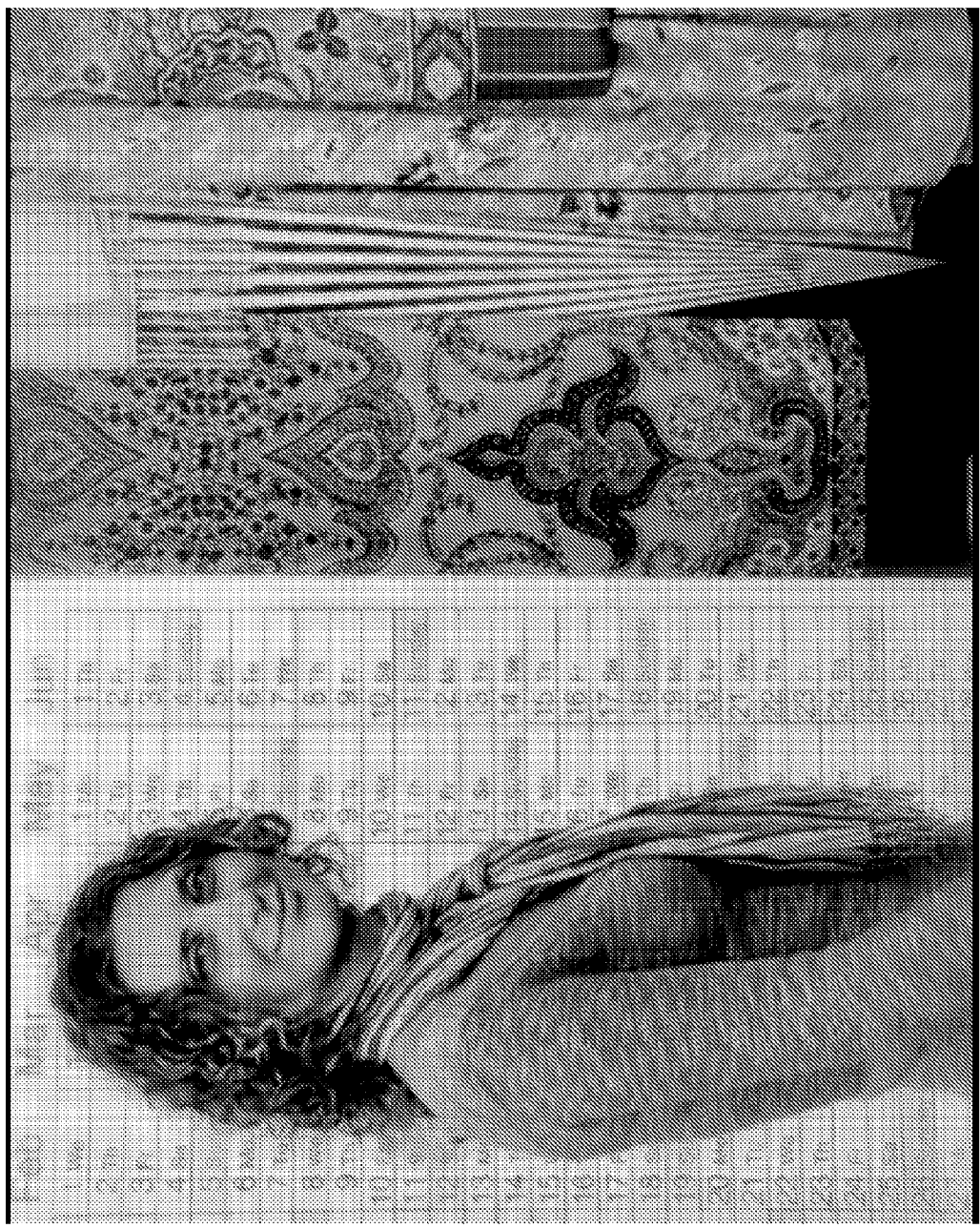
FIG. 18 is an illustration of a test image achieved for an image projection system in accordance with some embodiments of the invention.

In another example, an image of FIG. 15 may be projected the surface having a shape as given by FIG. 12. FIG. 16 illustrates the resulting image using a conventional fixed image plane, FIG. 17 illustrates the result that can be obtained using a moving image plane only, without pre-filtering, and FIG. 18 illustrates the result that can be obtained using a moving image plane and together with a suitable pre-filter for compensation of the blurring effect. As illustrated, FIG. 17 demonstrates a substantially improved and more homogenous image quality over the quality of FIG. 16, and FIG. 18 demonstrates a superior quality over FIG. 16 and FIG. 17. In particular, it can be seen that the approach substantially improves the sharpness that can be achieved in areas which in the prior art experience a high degree of blurring while at the same time maintaining sharpness in the areas that are sharp in the prior art.

It will be appreciated that an ideal pre-compensation filter cannot always be applied. Indeed, in many embodiments such an approach would require the pre-compensation filter to generate "negative" light that could cancel out light blurring from other points on the surface. This may result in some clipping artifacts which may be perceived as a reduced contrast of the projected image if one would compare it to a sharply focused projection. The reduced contrast is mostly observed in very dark or very bright areas and also in proximity to sharp image edges. However, an advantage of the described approach is that the blurring kernel resulting from the movement of the image plane tends to be very well behaved numerically and therefore well suited to pre-compensation by an approximate inverse filter. In particular, blurring kernels arising in practical systems tend to have few zeros in the frequency domain and therefore tend to not result in singularities for the inverse filter.

It will be appreciated that different movements of the image plane relative to the surface may be used in different embodiments. Indeed, as described previously, the blurring effect tends to mostly be dominated by the times when the image plane is close to the specific point on the surface and accordingly the blurring effect is relatively independent of the movement.

However, in many embodiments, improved performance may be achieved by controlling the motion such that, when the image plane is within a given distance of a point on the surface, then the movement of the image plane relative to the surface is substantially the same. Thus all points within the area of the surface on which the image is presented will experience substantially the same movement when the image plane is close to the point. This may specifically be achieved by ensuring that the movement is substantially linear within an interval that includes all points on the surface as well as possibly a sufficient margin with respect to the closest and furthest point. The given distance may for example be a tenth of the distance from the light projector (measured at the point of light radiation) to the midpoint of the variation interval. As another example, the given distance may simply be e.g. 10 cm or 50 cm.

The movement may in particular use a predetermined variation of the relative position of the surface and the image plane. The use of a predetermined variation may allow the blurring kernel to be predetermined and thus may allow the pre-filter to be predetermined during the design phase. Thus, the approach may facilitate implementation and/or operation and may thus avoid any calibration or adaptation to the specific application and use scenario.

The amplitude of the movement may specifically be at least e.g. 20%, 30% or 50%, 100% larger than the variation in the distance from the projector to the non-planer surface.

In many embodiments, the movement may specifically be a periodic variation, such as specifically a triangular variation wherein the movement alternates between movement in one direction followed by movement in the opposite direction. The movement in each direction may be a linear movement. Such a movement may be particularly advantageous as it will result in a symmetric movement which is identical for the different points on the surface (within an interval around the coincidence of the image plane and the point).

Figure 19:
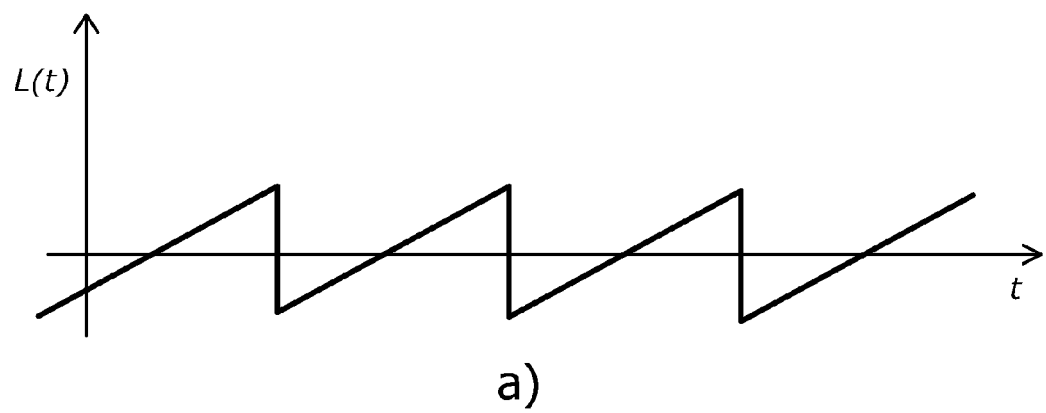
FIG. 19 is an illustration of movement patterns for an image plane relative to a projection surface in an image projection system in accordance with some embodiments of the invention.
Figure 19:
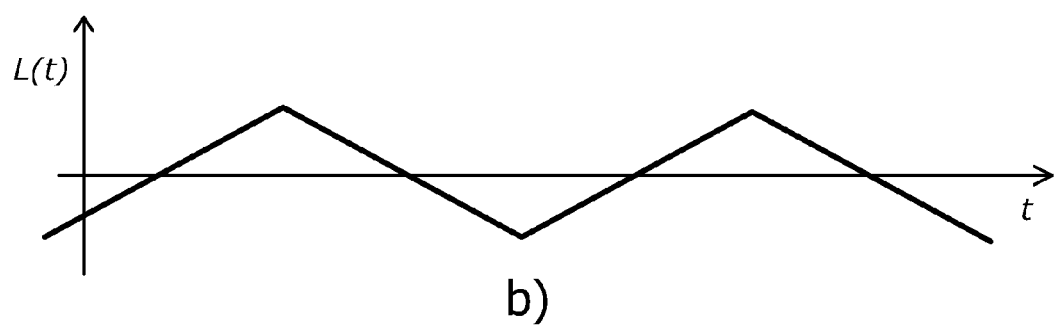

FIGS. 19(a) and 19(b) illustrates two examples of a triangular movement of the image plane relative to the surface.

FIG. 19(b) specifically illustrates an example wherein the movement in the two directions are substantially symmetric, i.e. the speed of the movement in one direction is approximately the same as the speed in the other direction. This may be particularly advantageous in many scenarios where the projected images are relatively static. In particular, it may tend to facilitate implementation as the symmetric movement can be achieved by relatively simple means.

FIG. 19(a) illustrates an example wherein the movement in the two directions are asymmetric, i.e. where the speed of the movement in one direction is much higher than the speed in the other direction. This may be particularly advantageous in many scenarios where the projected images are relatively dynamic with a lot of moving content. In particular, as previously described, the impact on the image for a given point is concentrated around the time at which the image plane coincides with the point. Thus, effectively, the image for a given point may be considered to be represented by the image in a short time interval around the coincidence time. Thus, the image may intuitively be considered to be generated by relatively short image "flashes" at times of coincidence. Furthermore, the times of the "flashes" will depend on the position of the specific point and on when the image plane coincides therewith. Thus, for a point coinciding with the mid position of the movement interval, the "flashes" are equidistant (in time) such that a regular "flash" pattern is achieved. However, for a symmetric movement, the "flashes" for points away from the mid position will not be equidistant but will tend to alternate between a short time interval and a longer time interval. For moving objects this will be perceived as a flickering effect that can be noticeable. However, by using an asymmetric pattern, which specifically may be substantially a saw tooth shape, this effect may be mitigated. Specifically, the image may be dominated by the movement in one direction thereby resulting in more equidistant "flashes" (as they effectively only occur for movement in one direction).

In order to improve the projection of moving objects one can light the projector only during the motion of the image plane in a specific direction. This approach however will cause a reduction in the light efficiency of the projector. The drop in the light efficiency can be minimized using the asymmetric motion of the image plane where the light is projected mainly during the slow motion in a certain direction, and then the light is reduced or completely switched off during the return motion of the image plane. The inventor observes also that the extreme case when the displacement of the image plane follows the saw tooth pattern does not cause a reduction in the light efficiency of the projector.

In cases where the image is an image/frame of a sequence of moving images (a video signal), the periodic variation may have a period of no more than two frame durations. Indeed, in many embodiments, the period may be set to substantially two frames. This may provide very advantageous presentation of a video signal and may in particular allow the movement of the image plane to be adapted (and e.g. synchronised) with the frame rate such that each frame is presented at least once by each point on the surface. For example, for the symmetric triangular shape, each direction of movement may be synchronised to correspond to a frame, such that each frame is presented once for each point on the surface.

In some embodiments, the periodic variation may advantageously have a period of no more than one frame duration. This may allow that each frame is covered by a full movement in both directions. This may for example allow each frame to be "flashed" twice by each point on the surface. Indeed, for the asymmetric saw tooth example of FIG. 19, such an approach may ensure appropriate presentation of each frame without relying on the time interval of the fast movement.

The periodic movement may in many embodiments be very fast. Indeed, even for static images a period of less than 0.5 seconds, 100 msecs or even 50 msecs may provide highly advantageous performance in many scenarios. In particular, it may be sufficiently fast for the human perception to combine the light from different positions of the image plane into a single image, thereby providing the averaging and homogeneous blurring effect substantially independent of the distance.

The movement may furthermore be very substantial. Indeed, in many embodiments the image projection apparatus may be arranged to vary a distance from the image projection apparatus to a point on the surface by at least the minimum distance from the image projection apparatus to the point. Thus, the variation for the points may be equal to or larger than the minimum distance to a point on the surface. The point may specifically be the point that has the shortest distance to the image projection apparatus. Thus, the described approach may allow a very large variation in the distance to the surface and thus allow a very high deviation from a planar surface while still providing a high quality image projection.

The minimum distance from the image projection apparatus to the point (e.g. corresponding to reference 615 on FIG. 6) may be approximately 1 meter and the variation interval (e.g. corresponding to the difference between reference 617 and 615 in FIG. 6, i.e. to the interval 613) may be two meters. This may result in relatively sharp pictures for any distance to a point on the surface of e.g. 1.3 to 2.8 meters from the light projector 605.

The previous example focussed on embodiments wherein the focus of the image projection apparatus is dynamically changed to move the image plane. However, it will be appreciated that alternatively or additionally the relative movement of the image plane and the surface may be achieved by introducing a movement of the surface, i.e. by moving the object. This movement will have a movement component in a movement plane perpendicular to the image plane, i.e. towards or away from the image projection apparatus in the example of FIG. 6.

The previous description also focused on an application wherein the image is projected on a non-planar surface. However, it will be appreciated that the approach may also be used in other embodiments.

For example, the relative movement of the image plane (for example by modifying the focus of the light projector 605) may also be used to provide improved image quality in a system where a lens may have spherical, chromatic or astigmatic aberrations. Indeed, such aberrations occur due to the variations in the distance to the image plane (either for different colors or for different light paths through the lens) and the continuous movement of the image plane will accordingly mitigate such sensitivities. In the case of chromatic aberrations however the projected color channel may have slightly different scaling ratios. Indeed, if both the distance between the lens and the surface and the focal length of the lens stay approximately the same while the distance between the lens and the object plane moves sharply, then the projected images for different colour channels will correspond to different distances between the lens and the object plane, which will correspond to different scaling ratios. Therefore in order to have the images corresponding to different color channels projected on top of each other, the approach may use pre-scale of the different colour components of the image before projection. Thus, in some embodiments, the system comprises means for prescaling one colour channel relative to another color channel.

For a given colour channel, the amount of scaling can be set proportional to the effective actual length of the lens for the given colour and inversely proportional to the distance between the lens and projector diminished with the actual focal length.

For example, in a system with 3 colour channels the actual focal lengths for the three colors can be $f_1$, $f_2$ and $f_3$ and the distance between the lens and the surface L. Then one can leave the first colour component of the image unscaled and scale the second and the third components with factors $$\frac{f_2}{f_1}\frac{(L-f_1)}{(L-f_2)} \approx \frac{f_2}{f_1}, \text{ and } \frac{f_3}{f_1}\frac{(L-f_1)}{(L-f_3)} \approx \frac{f_3}{f_1} \text{ for } L \gg f_1, f_2, f_3$$

The motion of the image plane can be also achieved in many other ways without affecting the scaling ratio of the projector. In this case the pre-scaling of different colour channels is not needed and the spherical aberrations are also better integrated resulting in an overall better image quality. For example, the motion of the image plane can be achieved by changing the focal length of the lens while keeping the ratio between the distances to the surface and the object plane approximately the same. Among the pure mechanical solutions, the changing of the focal length of the lens can be implemented using the fluid focus lens.

As another example, the projection system with fluctuating image plane may also be used to project the image on a moving surface (which may be planar or non-planar). The movement of the surface may specifically be in a direction (or at least have a movement component in the direction) parallel to the image plane.

Figure 20:
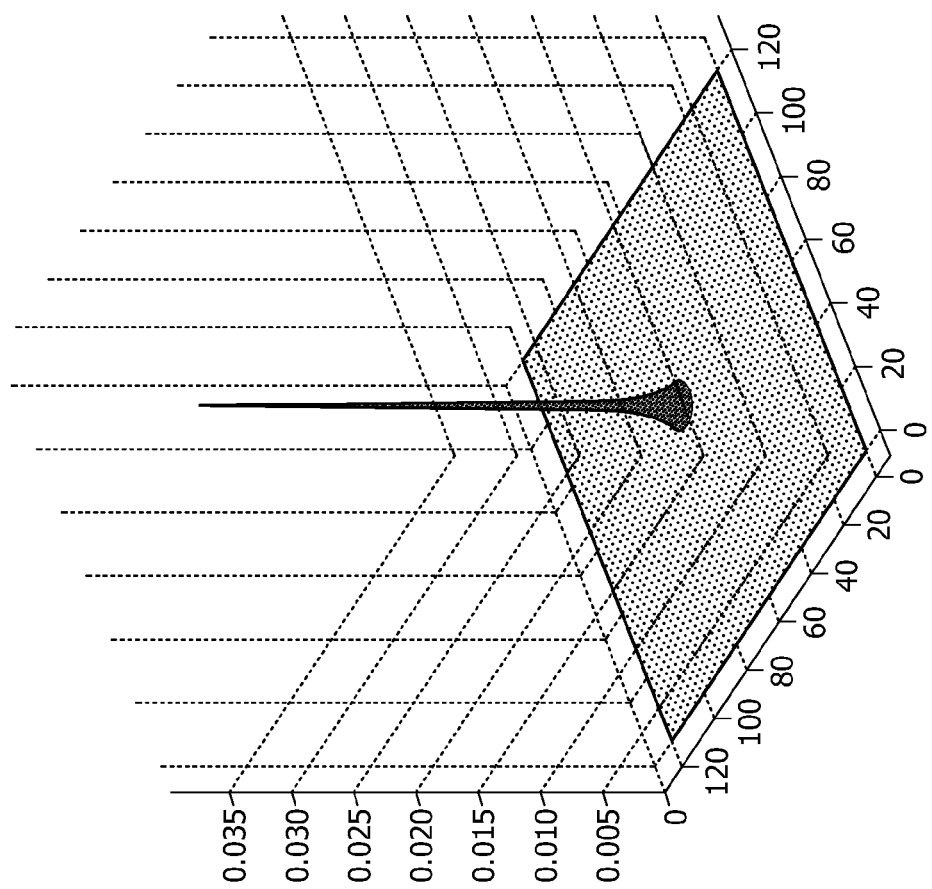
FIG. 20 is an illustration of an equivalent blurring radius/variance as a function of time.
Figure 20:
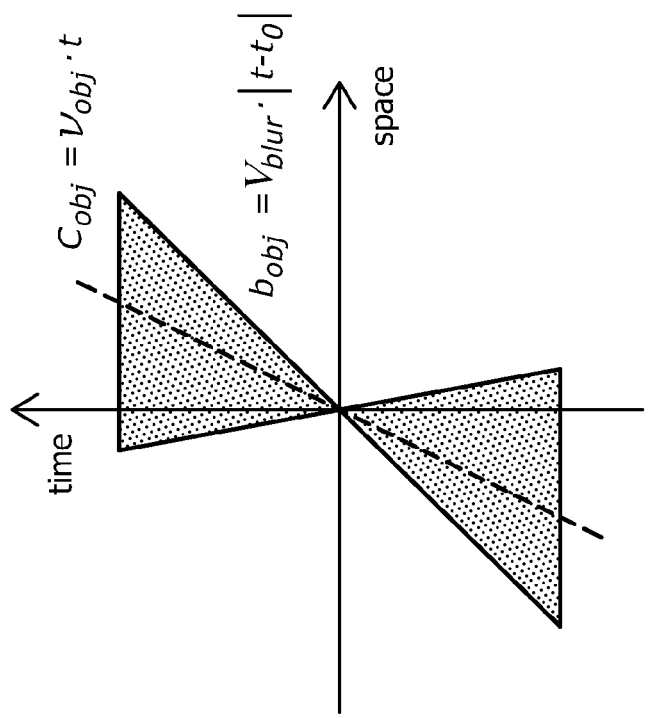

Such a movement will typically result in a perceived motion blur if the viewer tracks the moving surface with his eyes. However, if the variation of the image plane introduces a more substantial blurring effect, then the motion blur will no longer be perceived. Indeed, the motion of the surface will cause a shearing of the blurring diagram, see FIG. 20, and the moderate surface speeds may hardly affect the equivalent system kernel after the image integration. The maximum surface speed that can be tolerated is typically about 0.8 times the blurring speed on the surface caused by the moving image plane, $$v_{surf} = 0.8 \cdot V_{surf,blur}$$

where the blurring speed on the surface and the equivalent blurring speed on the object plane are related via the scaling ratio of the projector $$V_{blur} = \frac{x}{y} V_{surf,blur}$$

The maximum surface speed can be expressed in the parameters of the optical system as 0.8 multiplied by the aperture size α, multiplied by the distance L between the surface and the lens, multiplied by the speed $v_x$ of changing the distance between the lens and the object plane, and divided by the squared distance between the lens and the object plane:

$$v_{surf} = 0.8 \frac{aL}{x^2} v_x$$

It is noted that the blurring on the surface caused by the moving image plane results in much less picture quality degradation.

Furthermore, as previously discussed, the image plane movement can be pre-compensated thereby resulting in an improved perceived image quality.

The described approach may be used in many different applications and for many different purposes. Indeed, as described in the previous examples, the approach may be used to project an image for viewing by a person. However, the approach is not limited to such a specific application.

For example, the display system may be a photolithography system. Thus, in some systems, the object may be a lithography plate. Indeed, in lithography it is important to focus exactly on a target which is not perfectly flat. The proposed projection method is less sensitive to focus distortions and lens aberrations than the traditional projection and can accordingly provide a substantially improved photolithography system. Indeed, the movement of the image plane can be achieved by adjusting the focus of the light projector or alternatively (or additionally) can be achieved by introduction of micro-vibrations of the target, i.e. of the lithography plate. An advantage of the described system is that the exact nature of such micro-vibrations is not highly significant and need not be known in order to perform an efficient pre-compensation.

As another example, the approach may be used to perform laser cutting and/or burning. Indeed, a laser source with oscillating focus can create a much higher power density on non-flat or moving surfaces than a laser source with fixed focus.

It will be appreciated that the above description for clarity has described embodiments of the invention with reference to different functional units and processors. However, it will be apparent that any suitable distribution of functionality between different functional units or processors may be used without detracting from the invention. For example, functionality illustrated to be performed by separate processors or controllers may be performed by the same processor or controllers. Hence, references to specific functional units are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements or method steps may be implemented by e.g. a single unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to "a", "an", "first", "second" etc do not preclude a plurality. Reference signs in the claims are provided merely as a clarifying example shall not be construed as limiting the scope of the claims in any way.

The invention claimed is:

1. An image projection apparatus comprising:
a light projector for projecting an image onto a surface of an object;
a focussing device for focussing the image on an image plane;
a controller for dynamically varying a position of the image plane relative to the surface in accordance with a predetermined motion that will effect a determinable blurring of the image, if not corrected; and
a filter for applying an inverse blurring to the image prior to the projection by the light projector to pre-compensate for the determinable blurring.

2. The image projection apparatus of claim 1 where the filter is adapted to pre-compensate for a nominal blurring effect independently of a distance between the image plane and the surface.

3. The image projection apparatus of claim 1 where the predetermined motion enables the determinable blurring of the image to be predetermined.

4. The image projection apparatus of claim 1 where the controller is adapted to impart a periodic variation of the position of the image plane relative to the surface.

5. The image projection apparatus of claim 4 where the periodic variation corresponds to a triangular distance-versus-time variation in a distance between the image plane and a point on the surface.

6. The image projection apparatus of claim 4 where the image comprises a frame of a video signal and the periodic variation has a period of no more than two frame durations.

7. The image projection apparatus of claim 1 where the controller is adapted to dynamically vary a focus of the light projector to effect dynamic variation of the position of the image plane.

8. The image projection apparatus of claim 1 where the controller is adapted to dynamically vary a position of the surface.

9. The image projection apparatus of claim 1 where the controller is adapted to vary a distance from the image projection apparatus to a point on the surface by at least a minimum distance from the image projection apparatus to the point.

10. The image projection apparatus of claim 1 where the controller is adapted to provide a substantially linear movement of the image plane relative to the surface for positions of the image plane between an image point of the surface closest to the projector and an image point of the surface furthest from the light projector.

11. An image projection system comprising:
an object having a surface;
a light projector for projecting an image onto the surface of the object;
a focussing device for focussing the image on an image plane;
a controller for dynamically varying a position of the image plane relative to the surface in accordance with a predetermined motion that will effect a determinable blurring of the image, if not corrected; and
a filter for applying an inverse blurring to the image prior to the projection by the light projector to pre-compensate for the determinable blurring.

12. The image projection system of claim 11 where the surface comprises a non-planar surface.

13. The image projection system of claim 11 comprising apparatus for moving the surface to effect said dynamic variation of a position of the image plane relative to the surface, the movement having a movement component in a movement plane perpendicular to the image plane.

14. The image projection system of claim 11 where said system comprises a photolithography system.

15. A method of image projection comprising:
projecting an image onto a surface of an object;
focussing the image on an image plane;
dynamically varying a position of the image plane relative to the surface in accordance with a predetermined motion that will effect a determinable blurring of the image, if not corrected; and
applying an inverse blurring filtering to the image prior to the projection of the image onto the surface of the object to pre-compensate for the determinable blurring.

\* \* \* \* \*